United States Patent
Yamamoto

(10) Patent No.: US 10,291,204 B2
(45) Date of Patent: May 14, 2019

(54) PIEZOELECTRIC VIBRATOR ELEMENT, PIEZOELECTRIC VIBRATOR, ELECTRONIC APPARATUS, AND VEHICLE

(71) Applicant: SEIKO EPSON CORPORATION, Tokyo (JP)

(72) Inventor: Yusuke Yamamoto, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 296 days.

(21) Appl. No.: 15/285,216

(22) Filed: Oct. 4, 2016

(65) Prior Publication Data

US 2017/0111026 A1  Apr. 20, 2017

(30) Foreign Application Priority Data

Oct. 19, 2015  (JP) .................. 2015-205297

(51) Int. Cl.
  *H01L 41/047*  (2006.01)
  *H03H 9/19*  (2006.01)
  *H03H 9/02*  (2006.01)
  *H03H 9/10*  (2006.01)

(52) U.S. Cl.
  CPC .......... *H03H 9/19* (2013.01); *H01L 41/0477* (2013.01); *H03H 9/02023* (2013.01); *H03H 9/1021* (2013.01)

(58) Field of Classification Search
  CPC .... H03H 9/19; H03H 9/02023; H03H 9/1021; H01L 41/0477
  USPC ................................ 310/363–366
  See application file for complete search history.

(56) References Cited

U.S. PATENT DOCUMENTS

| | | | |
|---|---|---|---|
| 2005/0151450 A1 | 7/2005 | Umeki et al. | |
| 2013/0043959 A1* | 2/2013 | Ishii ..................... | H03H 9/0542 331/158 |

FOREIGN PATENT DOCUMENTS

| | | |
|---|---|---|
| JP | H11-284484 A | 10/1999 |
| JP | 2005-203858 A | 7/2005 |
| JP | 2009-044482 A | 2/2009 |
| JP | 2014-007693 A | 1/2014 |

* cited by examiner

Primary Examiner — Thomas M Dougherty
(74) Attorney, Agent, or Firm — Oliff PLC

(57) ABSTRACT

A piezoelectric vibrator element includes a piezoelectric substrate including a vibrating part and a fixation part, a first excitation electrode including a first foundation electrode layer disposed on a first surface of the vibrating part, and a first upper electrode layer disposed on the first foundation electrode layer, and a second excitation electrode including a second foundation electrode layer disposed on a second surface of the vibrating part, opposed to the first surface, and a second upper electrode layer disposed on the second foundation electrode layer, wherein a ratio $t_{42}/T_1$ between a thickness $t_{42}$ of the second upper electrode layer and a thickness $T_1$ of the vibrating part is not lower than 1.4% and not higher than 2.4%.

24 Claims, 10 Drawing Sheets

PIEZOELECTRIC VIBRATOR ELEMENT, PIEZOELECTRIC VIBRATOR, ELECTRONIC APPARATUS, AND VEHICLE

CROSS-REFERENCE TO RELATED APPLICATIONS

The present application claims priority to Japanese Patent Application JP 2015-205297, filed Oct. 19, 2015, the entire disclosure of which is hereby incorporated by reference herein.

BACKGROUND

1. Technical Field

The present disclosure relates to a piezoelectric vibrator element, a piezoelectric vibrator, an electronic apparatus, and a vehicle.

2. Related Art

An AT-cut quartz vibrator as a piezoelectric vibrator for exciting a thickness-shear vibration as a principal vibration is suitable for miniaturization and higher frequency, and has a frequency-temperature characteristic exhibiting an excellent cubic curve, and is therefore used in a variety of fields such as an oscillator and electronic equipment. In particular, in recent years, due to the progress in speeding up of the processing speed of transmission communication equipment and OA equipment, or increase in capacity of communication data and a processing amount, a demand of increase in frequency to the AT-cut quartz crystal vibrator as a reference frequency signal source used therefor is increasing. In order to increase the frequency of the AT-cut quartz crystal vibrator excited in the thickness-shear vibration mode, it is common practice to achieve the higher frequency by decreasing the thickness of the vibrating part.

However, if the thickness of the vibrating part is decreased due to the increase in the frequency, there is a problem that an influence of thermal strain with the excitation electrode increases to deteriorate the frequency-temperature characteristic. To cope with the above, in JP-A-11-284484, there is disclosed the fact that in the AT-cut quartz crystal vibrator for obtaining the fundamental vibration of equal to or higher than 300 MHz by forming a recessed part in a part of either one or both of the surfaces of the AT-cut quartz crystal substrate to thereby provide a super-thin vibrating part to the bottom of the recessed part and forming a whole-area electrode on one surface of the quartz crystal substrate and forming partial electrodes on the other surface, it is possible to make the vibrational frequency deviation equal to or lower than ±40 ppm in at least the temperature range of −35° C. through +80° C. by using gold as at least the film material of the whole-area electrode and at the same time arranging that the ratio $t_x/T$ between the thickness T of the super-thin vibrating part and the film thickness $t_x$ obtained by reducing the whole-area electrode into quartz crystal density becomes in a range of 5% through 13%.

However, the AT-cut quartz crystal vibrator described in JP-A-11-284484 is effective for an improvement in frequency-temperature characteristic, but has a problem that the aging characteristic is degraded.

SUMMARY

An advantage of some aspects of the invention is to solve at least a part of the problem described above, and various embodiments of the invention can be implemented as the following aspects or application examples.

Application Example 1

A piezoelectric vibrator element according to this application example is a piezoelectric vibrator element adapted to obtain a fundamental vibration equal to or higher than 250 MHz by forming a first excitation electrode on a first surface of a vibrating part of a piezoelectric substrate having a vibrating part and a fixation part, and forming a second excitation electrode on a second surface located on a reverse side of the first surface, wherein the first excitation electrode is provided with a first foundation electrode layer made of a material other than gold, and located on the vibrating part, and a first upper electrode layer made of gold and located on the first foundation electrode layer, the second excitation electrode is provided with a second foundation electrode layer made of the same in material as the first foundation electrode layer, and located on the vibrating part, and a second upper electrode layer made of gold and located on the second foundation electrode layer, the second excitation electrode is smaller in area than the first excitation electrode, and in the planar view of the first and second surfaces, the second excitation electrode is located inside the outer periphery of the first excitation electrode, and a ratio $t_{42}/T_1$ between a thickness $t_{42}$ of the second upper electrode layer and a thickness $T_1$ of the vibrating part is in a range of not lower than 1.4% and not higher than 2.4%.

According to this application example, by setting the ratio $t_{42}/T_1$ between the thickness $t_{42}$ of the second upper electrode layer of the second excitation electrode for achieving the energy confinement due to the mass load effect and a thickness $T_1$ of the vibrating part in a range of not lower than 1.4% and not higher than 2.4%, it is possible to reduce the influence of the residual stress caused when forming the upper electrode layer between the piezoelectric substrate and the upper electrode layer, and it is possible to obtain the piezoelectric vibrator element superior in aging characteristic.

Application Example 2

In the piezoelectric vibrator element according to the application example described above, it is preferable that a thickness of the fixation part is thicker than a thickness of the vibrating part.

According to this application example, since the thickness of the fixation part of the piezoelectric vibrator element is thicker than the thickness of the vibrating part, when fixing the fixation part, the stress strain due to the fixation is relaxed in the fixation part, and hard to be propagated to the vibrating part. Therefore, it is possible to obtain the piezoelectric vibrator element having a stable vibration characteristic and superior in aging characteristic.

Application Example 3

In the piezoelectric vibrator element according to the application example described above, it is preferable that a thickness of the first upper electrode layer is thinner than a thickness of the second upper electrode layer.

According to this application example, when adjusting the frequency, the thickness of the first excitation electrode having no influence on the energy confinement due to the mass load effect is reduced by a reverse sputtering treatment or the like to thereby make the thickness of the first excitation electrode thinner than the thickness of the second upper electrode layer. Therefore, it is possible to adjust the frequency to the desired frequency without deteriorating the vibration characteristic to thereby obtain the piezoelectric vibrator element small in frequency deviation.

Application Example 4

In the piezoelectric vibrator element according to the application example described above, it is preferable that the piezoelectric substrate is an AT-cut quartz crystal substrate.

According to this application example, since the AT-cut quartz crystal substrate is high in Q-value, and superior in temperature characteristic, it is possible to obtain the piezoelectric vibrator element having a stable vibration characteristic.

Application Example 5

A piezoelectric vibrator according to this application example includes the piezoelectric vibrator element according to any one of the application examples described above, and a substrate on which the piezoelectric vibrator element is mounted, the second excitation electrode is disposed so as to face the substrate, a fixation member is disposed between the fixation part and the substrate, and the fixation part is fixed to the substrate via the fixation member.

According to this application example, by fixing the fixation part of the piezoelectric vibrator element to the substrate via the fixation member, it is possible to stably vibrate the piezoelectric vibrator element. Further, since the second excitation electrode is disposed so as to face the substrate, it is possible to decrease the thickness of the first excitation electrode having no influence on the energy confinement due to the mass load effect using the reverse sputtering treatment or the like or increase the thickness using an evaporation treatment or the like. Therefore, it is possible to adjust the frequency to the desired frequency without affecting the vibration characteristic. Therefore, it is possible to obtain the piezoelectric vibrator having a stable vibration characteristic and small in frequency deviation.

Application Example 6

In the piezoelectric vibrator according to the application example described above, it is preferable that the substrate is provided with a wiring pattern, a second terminal electrically connected to the second excitation electrode is disposed on the second surface side in the fixation part, the fixation member has electrical conductivity, the second terminal and the wiring pattern are electrically connected to each other via the fixation member, a first terminal electrically connected to the first excitation electrode is disposed on the first surface side in the fixation part, and the first terminal is electrically connected to the wiring pattern with a bonding wire.

According to this application example, since the second terminal electrically connected to the second excitation electrode is supported and fixed at the single point on the substrate with the fixation member having electrical conductivity, it is possible to reduce the propagation of the influence of the stress strain due to the fixation member to the vibrating part. Therefore, it is possible to obtain the piezoelectric vibrator superior in frequency-temperature characteristic and aging characteristic.

Application Example 7

A method of manufacturing a piezoelectric vibrator according to this application example includes a foundation electrode layer formation process for forming a first foundation electrode layer made of a material other than gold on a first surface of a vibrating part of a piezoelectric substrate having the vibrating part and a fixation part, and forming a second foundation electrode layer made of the same material as the material of the first foundation electrode layer on a second surface located on a reverse side of the first surface, an upper electrode layer formation process for forming a first upper electrode layer made of gold on the first foundation electrode layer so that a ratio $t_{A1}/T_1$ between the thickness $t_{A1}$ of the first upper electrode layer and the thickness $T_1$ of the vibrating part is in a range of not lower than 1.4% and not higher than 2.4%, and forming a second upper electrode layer made of the same material as the material of the first upper electrode layer on the second foundation electrode layer so that a ratio $t_{A2}/T_1$ between the thickness $t_{A2}$ of the second upper electrode layer and the thickness $T_1$ of the vibrating part is in a range of not lower than 1.4% and not higher than 2.4%, a frequency adjustment process for varying the thickness of the first upper electrode layer to thereby adjust the resonant frequency of the vibrating part, and a mounting process for fixing the fixation part to the substrate to mount the piezoelectric substrate on the substrate after the upper electrode formation process and before or after the frequency adjustment process.

According to this application example, since there are included the foundation electrode layer formation process for enhancing the adhesiveness between the piezoelectric substrate and the upper electrode layer, the upper electrode layer formation process for forming the upper electrode layers so that the ratio between the thickness of the second upper electrode layer of the second excitation electrode and the thickness of the vibrating part is in the range of not lower than 1.4% and not higher than 2.4% in order to reduce the deterioration of the aging characteristic, the frequency adjustment process for varying the thickness of the first upper electrode layer in order to adjust the frequency to the desired frequency, and the mounting process for fixing the fixation part to the substrate in order to stably vibrate the vibrating part, it is possible to manufacture the piezoelectric vibrator small in frequency deviation and superior in aging characteristic.

Application Example 8

An electronic apparatus according to this application example includes the piezoelectric vibrator element according to any one of the application examples described above.

According to this application example, by using the piezoelectric vibrator element small in frequency deviation and superior in aging characteristic to the electronic apparatus, the electronic apparatus high in reliability can be configured.

Application Example 9

A vehicle according to this application example includes the piezoelectric vibrator element according to any one of the application examples described above.

According to this application example, by using the piezoelectric vibrator element small in frequency deviation and superior in aging characteristic to the vehicle, the vehicle high in reliability can be configured.

BRIEF DESCRIPTION OF THE DRAWINGS

Various embodiments of the invention will now be described with reference to the accompanying drawings, wherein like numbers reference like elements.

DESCRIPTION OF EXEMPLARY EMBODIMENTS

Hereinafter, a piezoelectric vibrator element, a piezoelectric vibrator, a method of manufacturing the piezoelectric vibrator, an electronic apparatus, and a vehicle according to the disclosure will be described in detail based on some preferred embodiments shown in the accompanying drawings.

Piezoelectric Vibrator Element

Figure 1A:
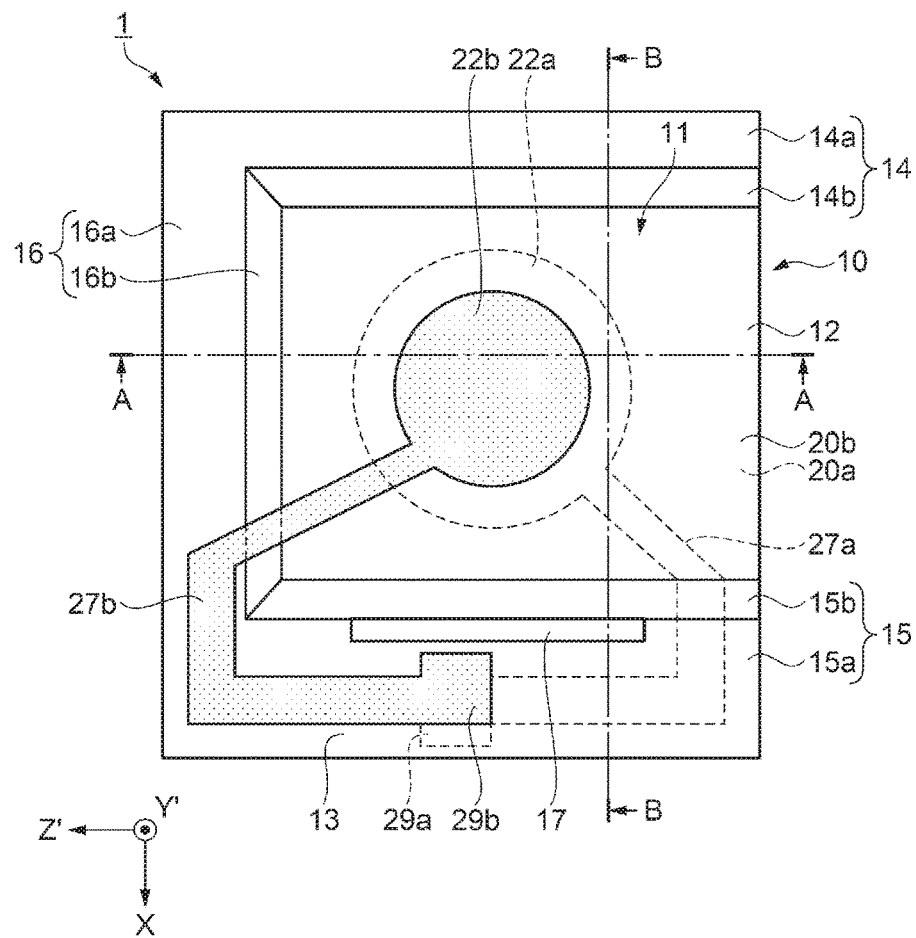
FIG. 1A is a schematic plan view showing a structure of a piezoelectric vibrator element according to an embodiment of the disclosure.
Figure 1B:
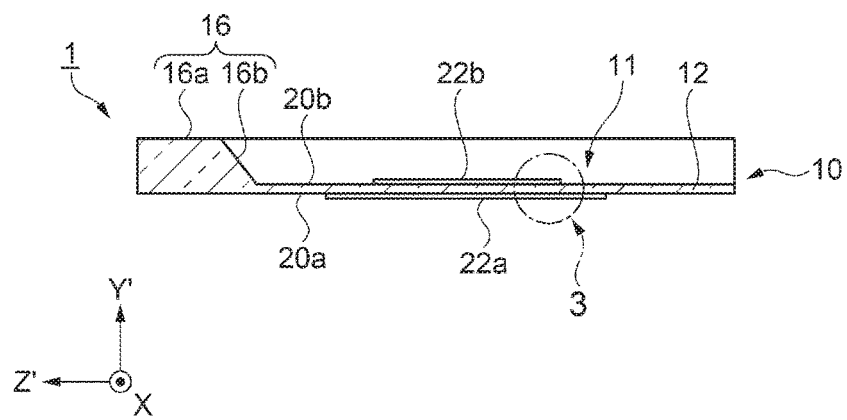
FIG. 1B is a schematic cross-sectional view along the line A-A in FIG. 1A.
Figure 1C:
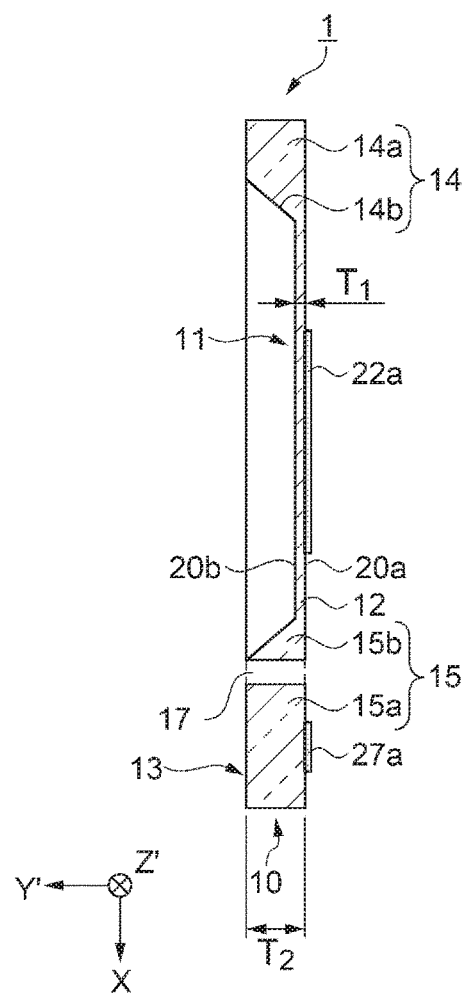
FIG. 1C is a schematic cross-sectional view along the line B-B in FIG. 1A.

Firstly, as an example of the piezoelectric vibrator element 1 according to an embodiment of the disclosure, there is cited a piezoelectric vibrator element having a so-called inverted-mesa structure having a recessed part 11 in a roughly central part of the substrate, and an explanation thereof will be presented with reference to FIG. 1A, FIG. 1B, and FIG. 1C.

FIG. 1A is a schematic plan view showing a configuration of the piezoelectric vibrator element according to the embodiment of the disclosure. FIG. 1B is a schematic cross-sectional view along the line A-A in FIG. 1A. FIG. 1C is a schematic cross-sectional view along the line B-B in FIG. 1A.

As shown in FIG. 1A, FIG. 1B, and FIG. 1C, the piezoelectric vibrator element 1 is provided with a piezoelectric substrate 10 having a vibrating part 12 and a fixation part 13 (with a thickness $T_2$) disposed contiguously to the vibrating part 12 and having a thickness greater than the thickness $T_1$ of the vibrating part 12, a first excitation electrode 22a and a second excitation electrode 22b formed respectively on both surfaces (obverse and reverse surfaces in the ±Y' directions), namely a first surface 20a and a second surface 20b, of the vibrating part 12 so as to be opposed to each other, a first terminal 29a and a second terminal 29b disposed respectively on both surfaces (obverse and reverse surfaces in the ±Y' directions) of the fixation part 13, and a first lead electrode 27a and a second lead electrode 27b formed so as to extend from the first excitation electrode 22a and the second excitation electrode 22b toward the first terminal 29a and the second terminal 29b, respectively.

The piezoelectric substrate 10 is provided with the vibrating part 12, which has a rectangular shape, and is shaped like a thin-wall plate perpendicular to the Y' axis with a constant thickness $T_1$, the fixation part 13 with a thickness T2 constituted by a first thick-wall part 14, a second thick-wall part 15, and a third thick-wall part 16 (also referred to as first, second, and third thick-wall parts 14, 15, and 16) integrated with each other along the three sides except one side of the vibrating part 12, and a slit 17 for preventing a mount stress caused when fixing and supporting the piezoelectric substrate 10 from being transmitted to the vibrating part 12.

It should be noted that a first thick-wall main body 14a, a second thick-wall main body 15a, and a third thick-wall main body 16a (also referred to as first, second, and third thick-wall main bodies 14a, 15a, and 16a) each denote a region having an even thickness in a direction parallel to the Y' axis.

Further, a first tilted part 14b, a second tilted part 15b, and a third tilted part 16b (also referred to as first, second, and third tilted parts 14b, 15b, and 16b) denote tilted surfaces respectively generated between the first, second, and third thick-wall main bodies 14a, 15a, and 16a and the vibrating part 12.

One (the first surface 20a) of the surfaces of the vibrating section 12 and one of the surfaces of each of the first, second, and third thick-wall parts 14, 15, and 16 are disposed on the same plane, namely on the X-Z' plane of the coordinate axes shown in FIG. 1A, the surface (the lower surface located on the −Y' side in FIG. 1B) is referred to as a flat surface, and the opposite surface (the upper surface located on the +Y' side in FIG. 1B) having a recessed part 11 is referred to as a recessed surface.

In the embodiment shown in FIG. 1A, FIG. 1B, and FIG. 1C, the first excitation electrode 22a and the second excitation electrode 22b are each formed to have a circular shape. It should be noted that the shape of the second excitation electrode 22b can also be an elliptical shape, a quadrangular shape, or a rectangular shape. Further, an octagon shape obtained by cutting the four corners of the quadrangular shape or the rectangular shape can also be adopted.

The first excitation electrode 22a and the second excitation electrode 22b are different in the area from each other, and the second excitation electrode 22b is smaller than the first excitation electrode 22a. Further, the first excitation electrode 22a and the second excitation electrode 22b overlap the both surfaces (the obverse surface and the reverse surface), namely the first surface 20a and the second surface 20b, in roughly the central part of the vibrating part 12 in a planar view, and are formed so that the second excitation electrode 22b is located inside the outer periphery of the first excitation electrode 22a.

The region actually vibrating in the vibrating part 12 is the region sandwiched by the first excitation electrode 22a and the second excitation electrode 22b. In other words, in the first excitation electrode 22a, the region making a contribution to making the vibrating part 12 actually vibrate is a part overlapping the second excitation electrode 22b in the planar view, and determines the vibration characteristic due to the energy confinement by the mass load effect. Further, the first excitation electrode 22a is constituted by an electrode making a contribution to the vibration and an electrode making no contribution to the vibration and integrated with the outer edge of the electrode making a contribution to the vibration, and does not have an influence on the energy confinement by the mass load effect. Therefore, when adjusting the frequency, by decreasing the thickness of the first excitation electrode 22a using a reverse sputtering treatment or the like, adjustment to the desired frequency can be achieved without deteriorating the vibration characteristic.

It should be noted that regarding the parts connected to the first lead electrode 27a and the second lead electrode 27b, the shapes and the areas of the first excitation electrode 22a and the second excitation electrode 22b will be explained taking an extended line (an imaginary line) along the outer edge (the outer side) of the excitation electrode shape as a boundary.

The second lead electrode 27b extends from the second excitation electrode 22b formed on the recessed surface, passes through the third tilted part 16b and the third thick-wall main body 16a from the surface of the vibrating part 12, and is conductively connected to the second terminal 29b formed on the recessed surface of the second thick-wall main body 15a. Further, the first lead electrode 27a extends from the first excitation electrode 22a formed on a flat surface, and is conductively connected to the first terminal 29a formed on the flat surface of the second thick-wall main body 15a via an end edge part of the flat surface of the piezoelectric substrate 10.

The embodiment shown in FIG. 1A is an example of an extraction structure of the lead electrodes 27a, 27b, and the lead electrodes 27a, 27b can pass through other thick-wall main bodies 14a, 15a, and 16a. However, it is desirable that the lengths of the lead electrodes 27a, 27b are the shortest, and it is desirable to suppress an increase in capacitance by giving consideration to preventing the lead electrodes 27a, 27b from intersecting with each other across the piezoelectric substrate 10.

Figure 2:
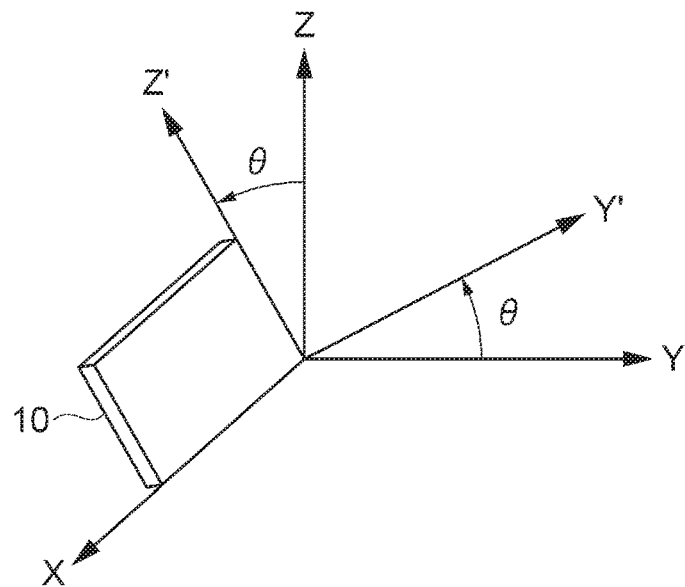
FIG. 2 is a diagram for explaining a relationship between an AT-cut quartz crystal substrate and the crystal axes.

Then, the piezoelectric substrate 10 of the piezoelectric vibrator element 1 according to the present embodiment will be described. FIG. 2 is a diagram for explaining a relationship between an AT-cut quartz crystal substrate and crystal axes. A piezoelectric material such as a quartz crystal belongs to a trigonal system, and has the crystal axes X, Y, and Z perpendicular to each other as shown in FIG. 2. The X axis, the Y axis, and the Z axis are called an electrical axis, a mechanical axis, and an optical axis, respectively. Further, among the quartz crystal substrates, a "rotated Y-cut quartz crystal substrate" carved out from the quartz crystal along a plane obtained by rotating the X-Z plane as much as the predetermined angle θ around the X axis is used as the piezoelectric substrate 10. For example, in the case of the AT-cut quartz crystal substrate, the angle θ is about 35° 15'. It should be noted that the Y axis and the Z axis are also rotated as much as the angle θ around the X axis to thereby obtain the Y' axis and the Z' axis. Therefore, the AT-cut quartz crystal substrate has the crystal axes X, Y', and Z' perpendicular to each other. In the AT-cut quartz crystal substrate, the thickness direction is the Y'-axis direction, the principal surface is the X-Z' plane (the plane including the X axis and the Z' axis) perpendicular to the Y' axis, and the thickness-shear vibration is excited as the principal vibration.

In other words, as shown in FIG. 2, assuming that an axis obtained by tilting the Z axis described above so that the +Z side of the Z axis is rotated toward the −Y direction of the Y axis described above using the X axis of the orthogonal coordinate system constituted by the X axis (the electrical axis), the Y axis (the mechanical axis), and the Z axis (the optical axis) as the rotational axis is the Z' axis, and an axis obtained by tilting the Y axis described above so that the +Y side of the Y axis is rotated toward the +Z direction of the Z axis described above using the X axis as the rotational axis is the Y' axis, the piezoelectric substrate 10 is the "rotated Y-cut quartz crystal substrate" taking the plane including the X axis described above and the Z' axis described above as a principal surface, and taking the direction along the Y' axis described above as the thickness direction.

It should be noted that the piezoelectric substrate 10 according to the present embodiment is not limited to the AT-cut substrate with the angle θ of 35° 15', but can widely be applied to, for example, a BT-cut substrate for exciting the thickness-shear vibration.

Further, although the explanation is presented using the example of disposing the thick-wall fixation part along the outer edge of the vibrating part 12, various embodiments of the invention are not limited to this example, but can widely be applied also to a substrate having the thick-wall fixation part disposed along the entire outer edge of the vibrating part 12, and a plate-like substrate not provided with the thick-wall fixation part.

Here, the piezoelectric vibrator element 1 according to the present embodiment uses the AT-cut quartz crystal substrate, which has the cutting angle superior in temperature characteristics, as the piezoelectric substrate 10, and therefore has an advantage that the piezoelectric vibrator element high in Q-value and superior in temperature characteristics can be obtained. Further, since accomplishments and experiences related to the photolithography technology and the etching technology can be utilized, mass production of the piezoelectric vibrator element 1 small in characteristic variation becomes possible.

Then, a configuration of the first excitation electrode 22a and the second excitation electrode 22b of the piezoelectric vibrator element 1 according to the present embodiment will be described with reference to FIG. 3.

Figure 3:
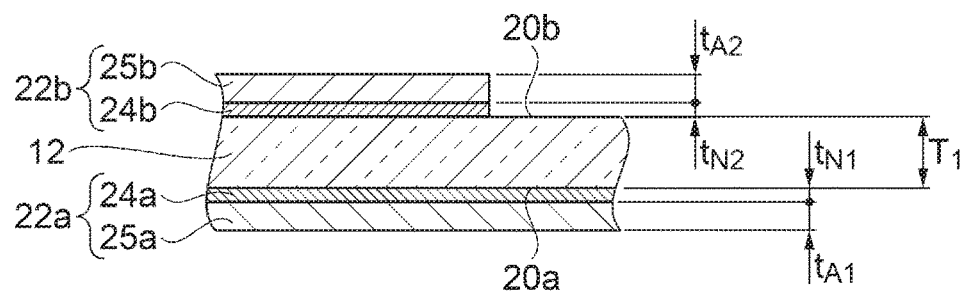
FIG. 3 is a partial enlarged view of FIG. 1B for explaining the relationship between a vibrating part and electrode layers constituting excitation electrodes.

FIG. 3 is a partial enlarged view of FIG. 1B for explaining the relationship between a vibrating part and electrode layers constituting the excitation electrodes.

As shown in FIG. 3, the first excitation electrode 22a is formed on the first surface 20a of the vibrating part 12, and is configured including a first foundation electrode layer 24a with a thickness $t_{N1}$ including a material such as nickel (Ni) other than gold (Au) and disposed on the vibrating part 12 with the thickness $T_1$, and a first upper electrode layer 25a with a thickness $t_{A1}$ made of gold (Au) and disposed on the first foundation electrode layer 24a. Further, the second excitation electrode 22b is formed on the second surface 20b of the vibrating part 12, and is configured including a second foundation electrode layer 24b with a thickness $t_{N2}$ made of the same material as that of the first foundation electrode layer 24a and disposed on the vibrating part 12 with the thickness $T_1$, and a second upper electrode layer 25b with a thickness $t_{42}$ made of the same material as that of the first upper electrode layer 25a and disposed on the second foundation electrode layer 24b.

Further, the first lead electrode 27a and the second lead electrode 27b, and the first terminal 29a and the second terminal 29b are also configured including the first foundation electrode layer 24a or the second foundation electrode layer 24b including a material such as nickel (Ni) other than gold (Au) and disposed on the piezoelectric substrate 10, and the first upper electrode layer 25a or the second upper electrode layer 25b made of gold (Au) and disposed on the first foundation electrode layer 24a or the second foundation electrode layer 24b, similarly to the first excitation electrode 22a and the second excitation electrode 22b.

Then, the aging characteristic of the piezoelectric vibrator element 1 according to the present embodiment will be explained with reference to FIG. 4.

Figure 4:
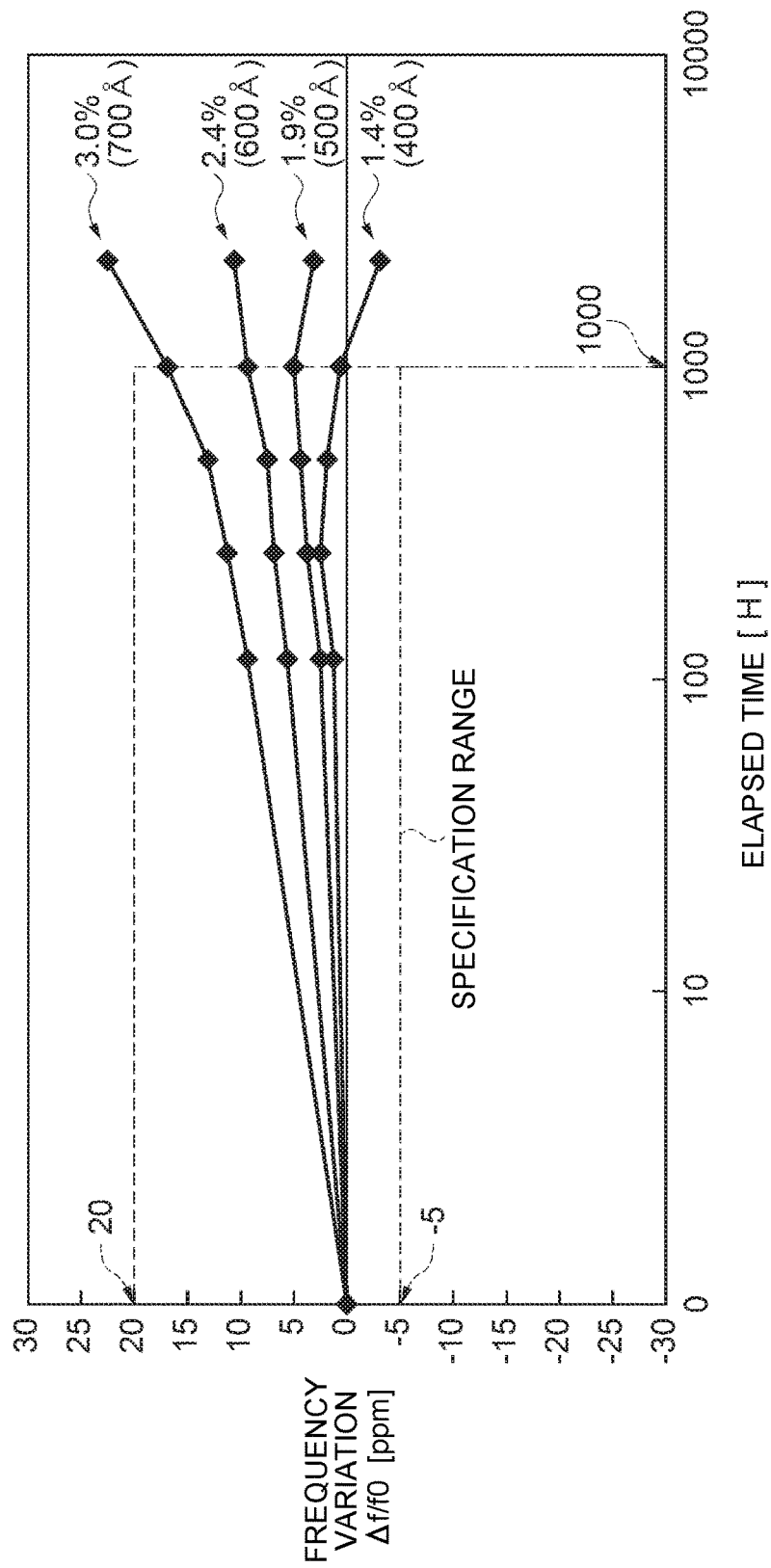
FIG. 4 is a diagram showing a relationship between the thickness of the electrode layers and the aging characteristic.

FIG. 4 is a diagram showing a relationship between the thickness of the electrode layers and the aging characteristic.

Samples evaluated in the aging characteristic are each an AT-cut quartz crystal vibrator using an AT-cut quartz crystal substrate as the piezoelectric substrate 10 and airtightly encapsulated in a ceramic package.

The piezoelectric vibrator elements 1 using the AT-cut quartz crystal substrate are experimentally manufactured so as to have the reference frequency of 491 MHz, and have the first foundation electrode layer 24a and the second foundation electrode layer 24b made of nickel (Ni) and each having a thickness of 70 Å (0.007 μm), the first upper electrode layer 25a and the second upper electrode layer 25b made of gold (Au) and each having a thickness varying in a range of 400 Å (0.04 μm) through 700 Å (0.07 μm) by 100 Å (0.01 μm).

Here, in the case in which the thickness $t_{42}$ of the second upper electrode layer 25b in each of the samples is 400 Å (0.04 μm), the thickness $T_1$ of the vibrating part 12 of the piezoelectric substrate 10 (the AT-cut quartz crystal substrate) becomes 2.77 μm, and $t_{42}/T_1$ is 1.4%. In the case in which the thickness $t_{42}$ is 500 Å (0.05 μm), the thickness $T_1$ becomes 2.63 w and $t_{42}/T_1$ is 1.9%. In the case in which the thickness $t_{42}$ is 600 Å (0.06 μm), the thickness $T_1$ becomes 2.48 w and $t_{42}/T_1$ is 2.4%. In the case in which the thickness $t_{42}$ is 700 Å (0.07 μm), the thickness $T_1$ becomes 2.33 w and $t_{42}/T_1$ is 3.0%. It should be noted that FIG. 4 shows a high-temperature aging characteristic at the preset temperature of 125° C., about 40 samples are experimentally manufactured in each of the conditions, the frequency variations $\Delta f/f_0$ at each of the elapsed time points are measured, and average values of about 40 measurement values are plotted.

As shown in FIG. 4, until the elapsed time of 1000 H, the aging characteristic with respect to the ratio $t_{42}/T_1$ between the thickness $t_{42}$ of the second upper electrode layer 25b and the thickness $T_1$ of the vibrating part 12 shows a tendency that the frequency variation $\Delta f/f_0$ changes toward the plus side in all of the conditions, and a tendency that the higher the ratio $t_{42}/T_1$ is, the larger the frequency variation $\Delta f/f_0$ becomes. Further, after the elapsed time exceeds 1000 H, the tendency that the frequency variation $\Delta f/f_0$ becomes large is continued in the conditions with the ratio $t_{42}/T_1$ having higher values of 2.4% and 3.0%, and at the ratio $t_{42}/T_1$ of 3.0%, there is shown a tendency that the frequency variation $\Delta f/f_0$ increases in an exponential manner. On the contrary, in the conditions with the ratio $t_{42}/T_1$ having lower values of 1.4% and 1.9%, there is shown a tendency that the frequency variation $\Delta f/f_0$ changes toward the minus side.

Here, if the aging characteristic specification of the piezoelectric vibrator element 1 used for an oscillator to be installed in an optical transmission network system or the like is assumed that the frequency variation $\Delta f/f_0$ is in a range of not smaller than −5 ppm and not larger than +20 ppm in the shelf test at 125° C. for 1000 H (equivalent to the shelf test at room temperature for 20 years), it results that the specification (not smaller than −5 ppm and not larger than +20 ppm) is satisfied in the conditions with the ratio $t_{42}/T_1$ in a range of 1.4% through 3.0% in this evaluation. However, since the variation of the 40 samples at the elapsed time of 1000 H is ±5 ppm, there occurs a case in which the specification is not satisfied. Further, the same applied to the case in which the ratio $t_{42}/T_1$ is lower than 1.4%. Therefore, taking the variation into consideration, by setting the ratio $t_{42}/T_1$ between the thickness $t_{42}$ of the second upper electrode layer 25b and the thickness $T_1$ of the vibrating part 12 in a range of not lower than 1.4% and not higher than 2.4%, the specification (not smaller than −5 ppm and not larger than +20 ppm) can be satisfied. It should be noted that it is conceivable that the reason that the aging characteristic specification (not smaller than −5 ppm and not larger than +20 ppm) can be satisfied as described above is that the thickness $T_1$ of the vibrating part 12 and the thickness $t_{42}$ of the second upper electrode layer 25b are optimized so as to reduce the influence of the residual stress caused when forming the second upper electrode layer 25b between the piezoelectric substrate 10 and the second upper electrode layer 25b.

As described hereinabove, in the piezoelectric vibrator element 1 according to the present embodiment, by setting the ratio $t_{42}/T_1$ between the thickness $t_{42}$ of the second upper electrode layer 25b of the second excitation electrode 22b and the thickness $T_1$ of the vibrating part 12 in the range of not lower than 1.4% and not higher than 2.4%, it is possible to reduce the influence of the residual stress caused when forming the second upper electrode layer 25b between the vibrating part 12 of the piezoelectric substrate 10 and the second upper electrode layer 25b. Therefore, it is possible to obtain the piezoelectric vibrator element 1, which satisfies the aging characteristic specification (not smaller than −5 ppm and not larger than +20 ppm), and is superior in the aging characteristic.

Further, since the thickness of the fixation part 13 of the piezoelectric vibrator element 1 is thicker than the thickness of the vibrating part 12, when fixing the fixation part 13, the stress strain due to the fixation is relaxed in the fixation part 13, and hard to be propagated to the vibrating part 12. Therefore, it is possible to obtain the piezoelectric vibrator element 1 having a stable vibration characteristic and superior in aging characteristic.

Further, since the thickness of the first upper electrode layer 25a is thinner than the thickness of the second upper electrode layer 25b, when adjusting the frequency, it is possible to adjust the frequency to the desired frequency without deteriorating the vibration characteristic by decreasing the thickness of the first upper electrode layer 25a constituting the first excitation electrode 22a having no influence on the energy confinement due to the mass load effect by a reverse sputtering treatment or the like. Therefore, it is possible to obtain the piezoelectric vibrator element 1 small in frequency deviation.

Further, by adopting the AT-cut quartz crystal substrate as the piezoelectric substrate 10, it is possible to obtain the piezoelectric vibrator element 1 high in Q-value, superior in temperature characteristic, and having a stable vibration characteristic.

Vibrator

Then, the piezoelectric vibrator 2 to which the piezoelectric vibrator element 1 according to the embodiment described above is applied will be described with reference to FIG. 5A and FIG. 5B.

Figure 5A:
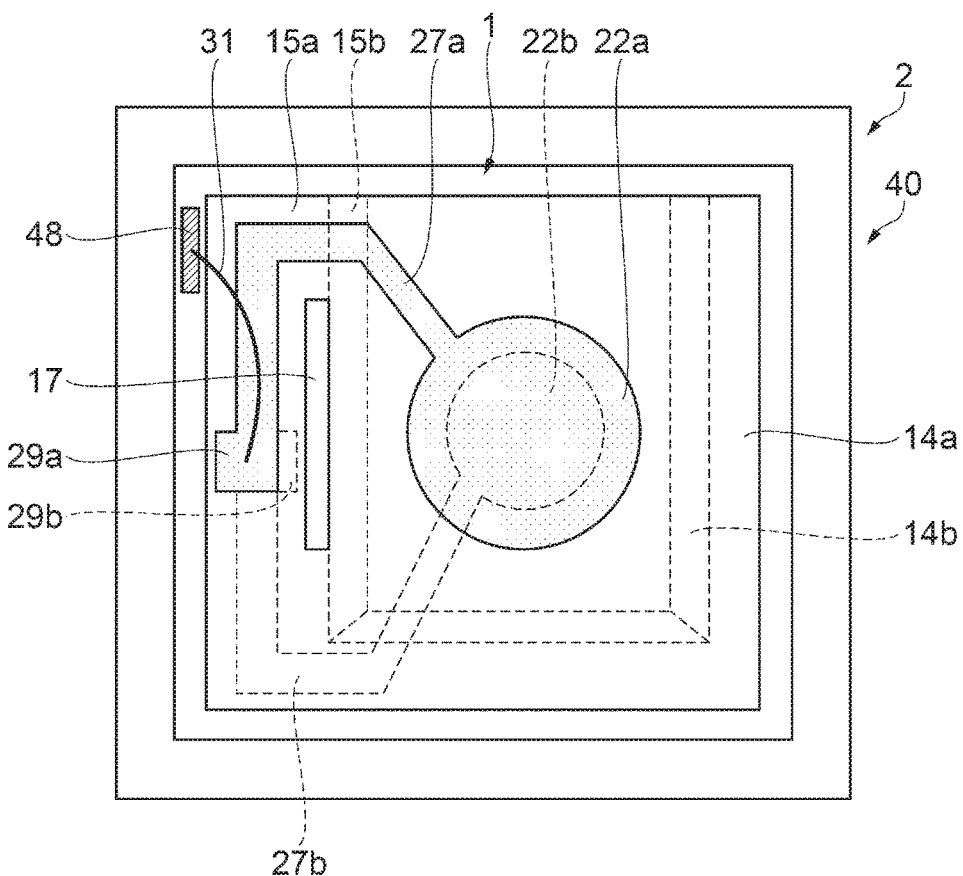
FIG. 5A is a schematic plan view showing a structure of a piezoelectric vibrator according to an embodiment of the disclosure.

FIG. 5A is a diagram showing a configuration of the piezoelectric vibrator according to the embodiment of the disclosure, and is a schematic plan view with a lid member omitted. FIG. 5B is a schematic vertical cross-sectional view of FIG. 5A.

The piezoelectric vibrator 2 is constituted by the piezoelectric vibrator element 1, a package main body 40 as a substrate formed to have a rectangular box shape in order to house the piezoelectric vibrator element 1, and the lid member 49 made of, for example, metal, ceramic, or glass.

Figure 5B:
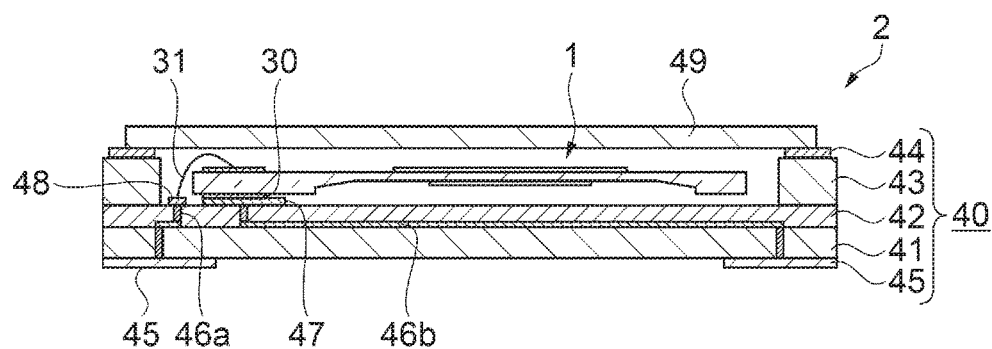
FIG. 5B is a schematic cross-sectional view of the piezoelectric vibrator shown in FIG. 5A.

As shown in FIG. 5A and FIG. 5B, the package main body 40 is formed by stacking a first substrate 41, a second substrate 42, a third substrate 43, a seal ring 44, mounting terminals 45 on one another. The mounting terminals 45 are formed on an exterior bottom surface of the first substrate 41. The third substrate 43 is a ring-like member with the central portion removed, and on the upper peripheral edge of the third substrate 43, there is formed the seal ring 44 made of, for example, Kovar™.

The third substrate 43 and the second substrate 42 constitute a recessed part (a cavity) for housing the piezoelectric vibrator element 1. At predetermined positions of the upper surface of the second substrate 42, there is a plurality of wiring patterns 47, 48 penetrating the first substrate 41 and the second substrate 42, and electrically connected to the mounting terminals 45 with conductors 46a, 46b formed in an inter-layer space between the first substrate 41 and the second substrate 42.

The wiring pattern 47 is arranged so as to correspond to the second terminal 29b provided to the second thick-wall main body 15a when mounting the piezoelectric vibrator element 1 in a flipped manner, and the wiring pattern 47 and the second terminal 29b electrically connected to the second excitation electrode 22b are conductively connected with a fixation member 30 having electrical conductivity such as an electrically-conductive adhesive. Further, since the wiring pattern 47 formed inside the cavity of the package main body 40 as the substrate and the second terminal 29b provided to the fixation part 13 of the piezoelectric vibrator element 1 are supported and fixed at a single point with the fixation member 30, it is possible to reduce the propagation of the influence of the stress strain due to the fixation member 30 to the vibrating part 12, and thus, it is possible to obtain the piezoelectric vibrator 2 capable of stably vibrating the piezoelectric vibrator element 1, and superior in frequency-temperature characteristic and the aging characteristic.

The wiring pattern 48 is disposed at a position not overlapping the piezoelectric vibrator element 1 in the planar view, and is conductively connected to the first terminal 29a, which is electrically connected to the first excitation electrode 22a, via a bonding wire 31. Further, since the first excitation electrode 22a having no influence on the energy confinement due to the mass load effect is disposed on the upper surface, it is possible to decrease the thickness of the first excitation electrode 22a using the reverse sputtering treatment or the like or increase the thickness using an evaporation treatment or the like. Therefore, it is possible to adjust the frequency to the desired frequency without affecting the vibration characteristic, and it is possible to obtain the piezoelectric vibrator 2 small in frequency deviation.

Therefore, the first excitation electrode 22a of the piezoelectric vibrator element 1 is conductively connected to the mounting terminal 45 disposed on the lower surface of the first substrate 41 via the first lead electrode 27a, the first terminal 29a, the bonding wire 31, the wiring pattern 48, and the conductor 46a.

Further, the second excitation electrode 22b of the piezoelectric vibrator element 1 is conductively connected to the mounting terminal 45 disposed on the lower surface of the first substrate 41 via the second lead electrode 27b, the second terminal 29b, the fixation member 30, the wiring pattern 47, and the conductor 46b.

As described hereinabove, by fixing the fixation part 13 of the piezoelectric vibrator element 1 to the substrate via the fixation member 30, it is possible to stably vibrate the piezoelectric vibrator element 1. Further, since the second excitation electrode 22b is disposed so as to face the package main body 40 as the substrate, it is possible to decrease the thickness of the first excitation electrode 22a having no influence on the energy confinement due to the mass load effect using the reverse sputtering treatment or the like or increase the thickness using an evaporation treatment or the like. Therefore, it is possible to adjust the frequency to the desired frequency without affecting the vibration characteristic. Therefore, it is possible to obtain the piezoelectric vibrator 2 having a stable vibration characteristic and small in frequency deviation.

Further, since the second terminal 29b electrically connected to the second excitation electrode 22b is supported and fixed at the single point on the package main body 40 as the substrate with the fixation member 30 having electrical conductivity, it is possible to reduce the propagation of the influence of the stress strain due to the fixation member 30 to the vibrating part 12. Therefore, it is possible to obtain the piezoelectric vibrator 2 superior in frequency-temperature characteristic and aging characteristic.

Method of Manufacturing Piezoelectric Vibrator

Then, a method of manufacturing the piezoelectric vibrator 2 according to an embodiment of the discloser will be described citing the piezoelectric vibrator 2 equipped with the piezoelectric vibrator element 1 having a so-called inverted-mesa structure having a recessed part 11 in a roughly central part of the substrate as an example with reference to FIG. 6. It should be noted that there is described an example using the AT-cut quartz crystal substrate as the piezoelectric vibrator 2.

Figure 6:
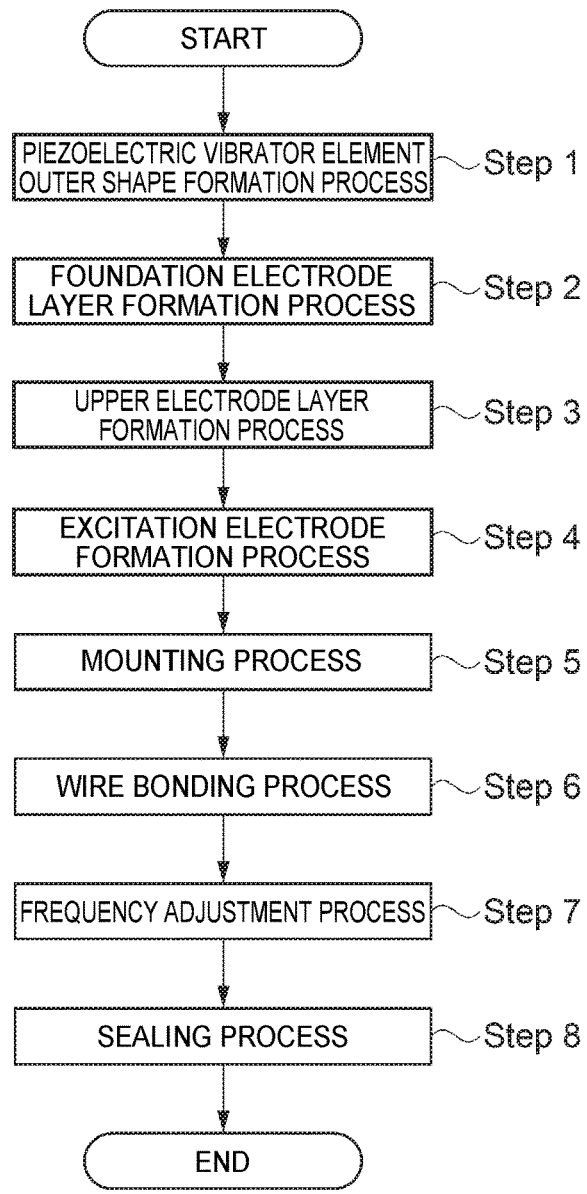
FIG. 6 is a flowchart showing a method of manufacturing the piezoelectric vibrator according to an embodiment of the disclosure.

FIG. 6 is a process chart showing a method of manufacturing the piezoelectric vibrator according to an embodiment of the disclosure.

Piezoelectric Vibrator Element Outer Shape Formation Process (Step 1)

Firstly, in the piezoelectric vibrator element outer shape formation process (Step 1), the recessed part 11 and the slit 17 are formed in the piezoelectric substrate 10 using a photolithography process. It should be noted that in the case of obtaining a number of piezoelectric vibrator elements 1 in a lump using a large substrate, the outer shape pattern of the piezoelectric substrate 10 is also formed at the same time when forming the slits 17 penetrating the piezoelectric substrate 10.

The piezoelectric substrate 10 is prepared, and then a metal film acting as a protective film when performing the etching treatment is deposited on the first surface 20a and the second surface 20b as the both surfaces of the piezoelectric substrate 10 using a sputtering treatment or an evaporation method. It should be noted that as the metal film, chromium (Cr) is deposited as the foundation film, and then gold (Au) is deposited on the foundation film. Then, a resist is applied on the metal film using a spin coater or the like, and is then dried. Subsequently, a pattern of the recessed part 11 is exposed on the second surface 20b side using an exposure device to develop the resist. Subsequently, gold and chromium as the metal film thus exposed are etched in sequence to form the pattern of the recessed part 11. The pattern area of the recessed part 11 where the piezoelectric substrate 10 is exposed is half-etched with a hydrofluoric acid type etchant to form the recessed part 11 in the piezoelectric substrate 10. It should be noted that the half-etching amount is an amount with which the vibrating part 12 in the recessed part 11 becomes to have the thickness corresponding to the desired frequency.

Then, the metal film used as the protective film for forming the pattern of the recessed part 11 is removed, and then the metal film (gold with the chromium foundation film) to be the protective film for forming the slit 17 and the outer shape of the piezoelectric vibrator element 1 is deposited again on the both surfaces (the first surface 20a and the second surface 20b) of the vibrating part 12 and the thick-wall fixation part 13 of the piezoelectric substrate 10 using a sputtering treatment or the evaporation method. Subsequently, a resist is applied on the metal film using a spin coater or the like, and is then dried. Subsequently, the pattern of the slit 17 and the outer shape pattern are exposed on the first surface 20a and the second surface 20b side using a double-sided exposure device to develop the resist. Subsequently, gold and chromium as the metal film thus exposed are etched in sequence to form the pattern of the slit 17 and the outer shape pattern. The pattern of the slit 17 and the outer shape pattern area where the piezoelectric substrate 10 is exposed are etched with the hydrofluoric acid type etchant from the both sides to form the slit 17 in the piezoelectric substrate 10 and the outer shape of the piezoelectric vibrator element 1. Subsequently, by removing the metal film used as the protective film, the piezoelectric substrate 10 having the inverted-mesa structure provided with the recessed part 11 and the slit 17 is completed.

Foundation Electrode Layer Formation Process (Step 2)

In the foundation electrode layer formation process (Step 2), the first foundation electrode layer 24a and the second foundation electrode layer 24b made of a material such as nickel (Ni) other than gold (Au) are deposited on the both surfaces (the first surface 20a and the second surface 20b) of the piezoelectric substrate 10 having the inverted-mesa structure using a sputtering treatment or the evaporation method. It should be noted that the deposition is performed so that the thickness $t_{N1}$ of the first foundation electrode layer 24a and the thickness $t_{N2}$ of the second foundation electrode layer 24b are equal to each other, and are 70 Å (0.007 μm).

Upper Electrode Layer Formation Process (Step 3)

Then, in the upper electrode layer formation process, the first upper electrode layer 25a and the second upper electrode layer 25b each made of gold (Au) are deposited on the first foundation electrode layer 24a and the second foundation electrode layer 24b, which are deposited on the both surfaces (the first surface 20a and the second surface 20b), using a sputtering treatment or the evaporation method. It should be noted that the deposition is performed so that the thickness $t_{A1}$ of the first upper electrode layer 25a and the thickness $t_{A2}$ of the second electrode layer 25b are equal to each other, and the ratio $t_{A1}/T_1$ and $t_{A2}/T_1$ with the thickness $T_1$ of the vibrating part 12 are in the range of not lower than 1.4% and not higher than 2.4%.

Excitation Electrode Formation Process (Step 4)

Subsequently, in the excitation electrode formation process (Step 4), the electrode patterns of the excitation electrodes 22a, 22b, the lead electrodes 27a, 27b, and the terminals 29a, 29b are formed on the piezoelectric substrate 10 using the photolithography method.

Firstly, a resist is applied on the upper electrode layers 25a, 25b on the both surfaces (the first surface 20a and the second surface 20b) of the piezoelectric substrate 10 using the spin coater or the like, and is then dried. Then, the electrode patterns are exposed on the both surfaces using the double-sided exposure device, and then the resist is developed. Subsequently, the electrode patterns of the upper electrode layers 25a, 25b are etched with the etchant for etching the upper electrode layers 25a, 25b to form the electrode patterns of the upper electrodes 25a, 25b. Then, the electrode patterns of the foundation electrode layers 24a, 24b are etched with the etchant for etching the foundation electrode layers 24a, 24b to form electrode patterns of the foundation electrode layers 24a, 24b. Here, the piezoelectric vibrator element 1 provided with the electrode patterns of the excitation electrodes 22a, 22b, the lead electrodes 27a, 27b, and the terminals 29a, 29b is completed.

Mounting Process (Step 5)

Then, in the mounting process (Step 5), the fixation member 30 such as the electrically-conductive adhesive having electrical conductivity is applied on the wiring pattern 47 disposed on the second substrate 42 in the cavity of the package main body 40, and then the second terminal 29b of the piezoelectric vibrator element 1 is mounted on the fixation member 30 with alignment, and then a load is applied. Subsequently, the package main body 40 is input in an oven at a predetermined temperature for a predetermined period of time to make the fixation member 30 cure. Thus, the piezoelectric vibrator element 1 is fixed in the cavity of the package main body 40, and at the same time, the second terminal 29b of the piezoelectric vibrator element 1 and the wiring pattern 47 disposed on the second substrate 42 are conductively connected to each other via the fixation member 30 having electrical conductivity.

Wire Bonding Process (Step 6)

In the wire bonding process (Step 6), the first terminal 29a of the piezoelectric vibrator element 1 mounted in the cavity of the package main body 40 and the wiring pattern disposed on the second substrate 42 are conductively connected to each other via the bonding wire 31 using a wire bonding device or the like.

Frequency Adjustment Process (Step 7)

Then, in the frequency adjustment process (Step 7), an annealing treatment is performed, and then a reverse sputtering treatment or the like is performed on the first excitation electrode 22a to reduce the thickness of the first upper electrode layer 25a to thereby raise the frequency to adjust the frequency to the desired frequency. Therefore, the thickness of the first upper electrode layer 25a of the first excitation electrode 22a becomes thinner than the thickness of the second upper electrode layer 25b of the second excitation electrode 22b. It should be noted that although in the present embodiment the frequency adjustment is performed after the piezoelectric vibrator element 1 is mounted on the package main body 40, the various embodiments are not limited to this configuration, but it is also possible to adopt a method of performing the frequency adjustment before mounting the piezoelectric vibrator element 1 on the package main body 40, or a method of performing the frequency adjustment twice, namely before and after mounting the piezoelectric vibrator element 1 on the package main body 40. If the adjustment is performed before mounting the piezoelectric vibrator element 1 on the package main body 40, a number of piezoelectric vibrator elements 1 formed on the large substrate can be processed in a lump, therefore, reduction in cost of the piezoelectric vibrator 2 can be achieved. Further, in the method of performing the process before and after the mounting on the package main body 40, by performing a coarse adjustment before the mounting and then performing a fine adjustment after the mounting, the frequency adjustment higher in accuracy can be performed, and therefore, the piezoelectric vibrator 2 smaller in frequency deviation can be obtained.

Further, as the method of adjusting the frequency, it is also possible to adopt a method of attaching the same material as the first upper electrode layer 25*a*, namely gold (Au), using the evaporation method or a sputtering treatment to decrease the frequency to adjust the frequency to the desired frequency.

Sealing Process (Step 8)

Subsequently, in the sealing process (Step 8), the lid member 49 is mounted on the seal ring 44 formed on the upper surface of the package main body 40, and then sealing is performed by seam-welding the lid member 49 in a reduced-pressure atmosphere, or a nitrogen gas atmosphere to thereby complete the piezoelectric vibrator 2. It should be noted that although in the description of the present embodiment, the package main body 40 provided with the seal ring 44 disposed on the upper surface of the third substrate 43 is used, various embodiments of the invention are not limited to this configuration, but it is also possible to adopt a method of mounting the lid member 49 on low-melting-point glass applied on the upper surface of the third substrate 43 of the package main body 40, and then melting the low-melting-point glass to be attached tightly. Also in this case, the cavity of the package is kept in the reduced-pressure atmosphere or filled with an inert gas such as a nitrogen gas to thereby complete the piezoelectric vibrator 2.

As described hereinabove, since there are included the foundation electrode layer formation process of forming the foundation electrode layers 24*a*, 24*b* for enhancing the adhesiveness between the piezoelectric substrate 10 and the upper electrode layers 25*a*, 25*b*, the upper electrode layer formation process of forming the upper electrode layers so that the ratio $t_{A2}/T_1$ between the thickness $t_{A2}$ of the second upper electrode layer 25*b* of the second excitation electrode 22*b* and the thickness $T_1$ of the vibrating part 12 becomes in the range of not lower than 1.4% and not higher than 2.4% for reducing the deterioration of the aging characteristic, the frequency adjustment process of changing the thickness of the first upper electrode layer 25*a* in order to achieve the adjustment to the desired frequency, and the mounting process of fixing the fixation part 13 to the package main body 40 in order to stably vibrate the vibrating part 12, the piezoelectric vibrator 2 small in frequency deviation and superior in aging characteristic can be manufactured.

Electronic Apparatus

Then, some electronic apparatuses, to which the piezoelectric vibrator element 1 is applied, according to some embodiments of the invention will be described with reference to FIG. 7 through FIG. 10.

Figure 7:
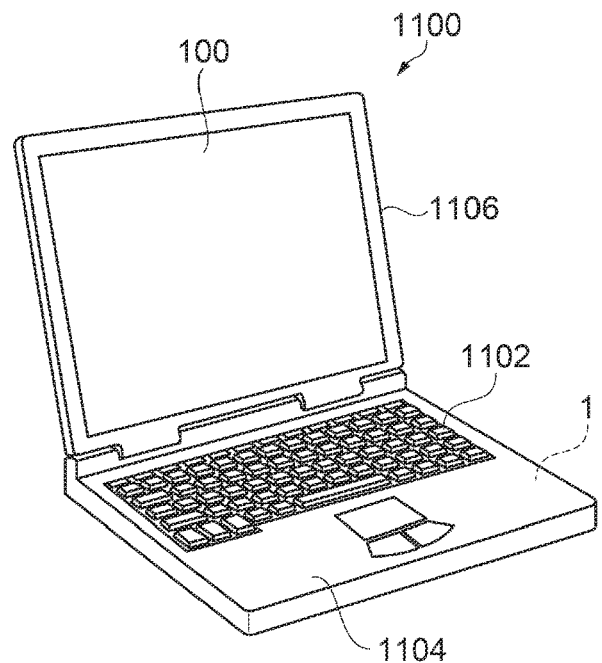
FIG. 7 is a perspective view showing a configuration of a mobile type (or laptop type) personal computer as an application of the electronic apparatus equipped with the piezoelectric vibrator element according to an embodiment of the disclosure.

FIG. 7 is a perspective view showing a configuration of a mobile type (or laptop type) personal computer as a first example of the electronic apparatus according to the disclosure. In the drawing, the personal computer 1100 includes a main body 1104 provided with a keyboard 1102, and a display unit 1106 provided with a display 100, and the display unit 1106 is pivotally supported with respect to the main body 1104 via a hinge structure. Such a personal computer 1100 incorporates the piezoelectric vibrator element 1 functioning as a vibrator, a reference clock, and so on.

Figure 8:
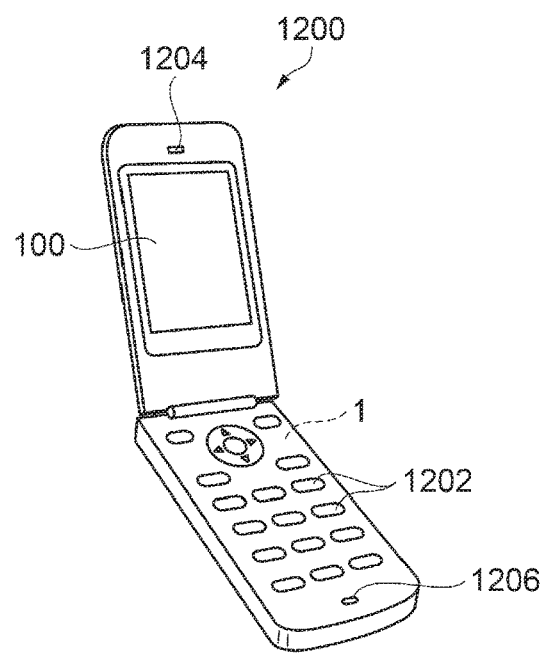
FIG. 8 is a perspective view showing a configuration of a cellular phone (including PHS) as an application of the electronic apparatus equipped with the piezoelectric vibrator element according to an embodiment of the disclosure.

FIG. 8 is a perspective view showing a configuration of a cellular phone (including PHS) as a second example of the electronic apparatus according to the disclosure. In this drawing, the cellular phone 1200 is provided with a plurality of operation buttons 1202, an ear piece 1204, and a mouthpiece 1206, and a display 100 is disposed between the operation buttons 1202 and the ear piece 1204. Such a cellular phone 1200 incorporates the piezoelectric vibrator element 1 functioning as a vibrator, an oscillator, and so on.

Figure 9:
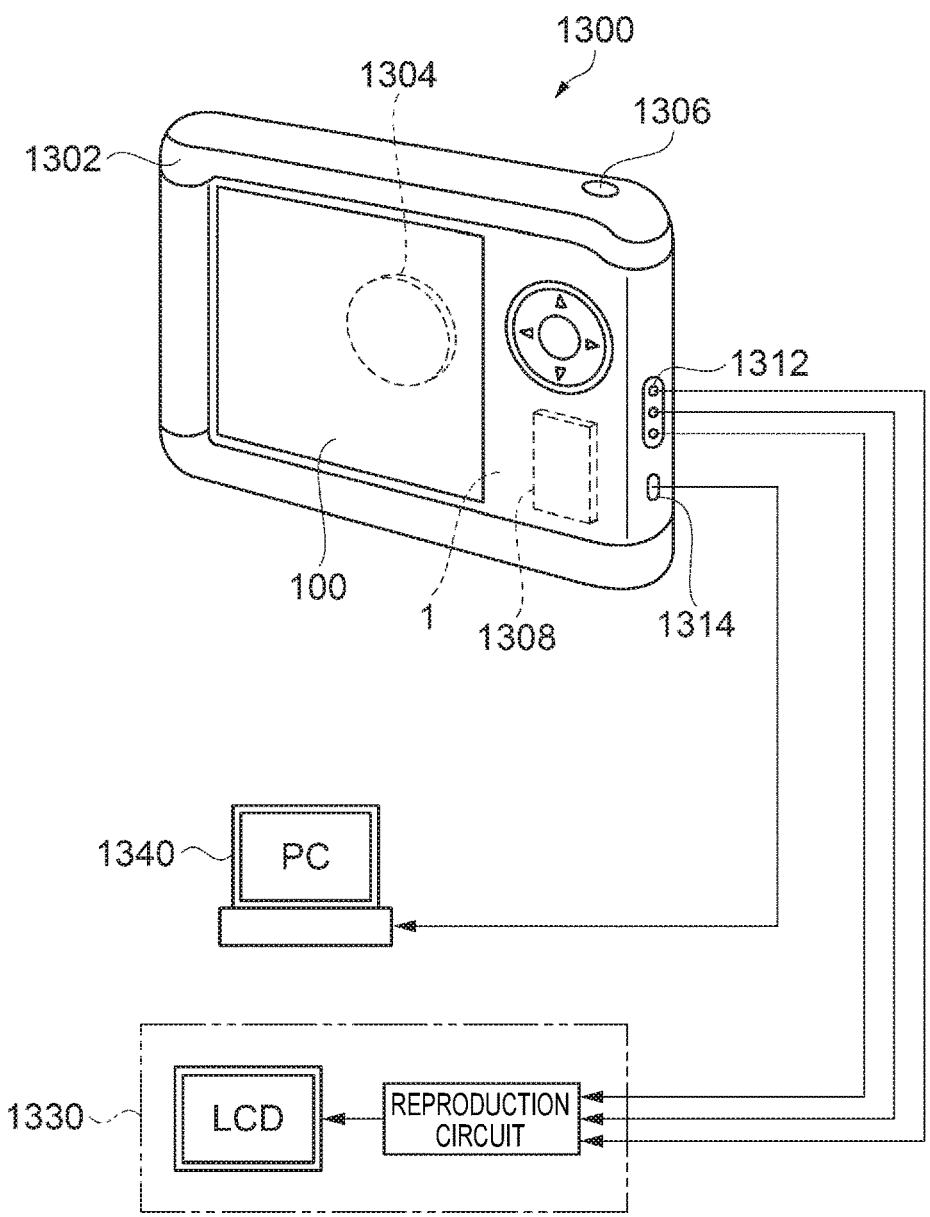
FIG. 9 is a perspective view showing a configuration of a digital still camera as an application of the electronic apparatus equipped with the piezoelectric vibrator element according to an embodiment of the disclosure.

FIG. 9 is a perspective view showing a configuration of a digital still camera as a third example of the electronic apparatus according to the disclosure. It should be noted that the connection to the external equipment is also shown briefly in this drawing. Here, an ordinary camera exposes a silver salt film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display 100 disposed on the back surface of the case 1302 to provide a configuration of performing display in accordance with the imaging signal from the CCD, wherein the display 100 functions as a viewfinder for displaying the object as an electronic image. Further, the front side (the reverse side in the drawing) of the case 1302 is provided with a light receiver 1304 including an optical lens (an imaging optical system), the CCD, and so on.

When the photographer checks an object image displayed on the display 100, and then holds down a shutter button 1306, the imaging signal from the CCD at that moment is transferred to and stored in a memory device 1308. Further, the digital still camera 1300 is provided with video signal output terminals 1312 and an input/output terminal 1314 for data communication disposed on a side surface of the case 1302. Further, as shown in the drawing, a television monitor 1330 and a personal computer 1340 are respectively connected to the video signal output terminals 1312 and the input-output terminal 1314 for data communication according to needs. Further, there is adopted the configuration in which the imaging signal stored in the memory device 1308 is output to the television monitor 1330 and the personal computer 1340 in accordance with a predetermined operation. Such a digital still camera 1300 incorporates the piezoelectric vibrator element 1 functioning as the vibrator, the reference clock, and so on.

Figure 10:
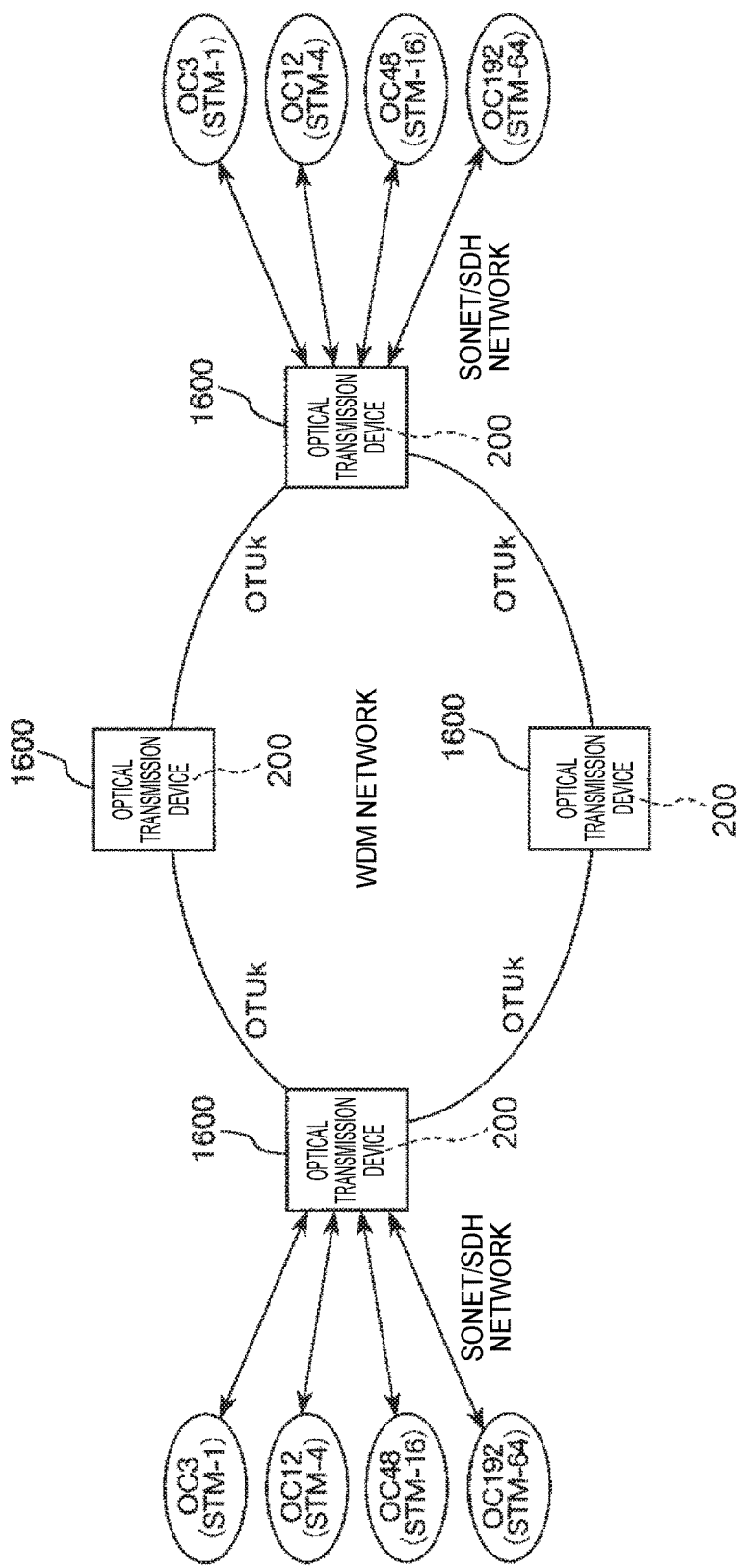
FIG. 10 is a schematic diagram of a network including optical transmission devices as an application of the electronic apparatus equipped with the piezoelectric vibrator element according to an embodiment of the disclosure.

FIG. 10 is a schematic diagram of a network including optical transmission devices as a fourth example of the electronic apparatus according to the disclosure. In the drawing, the optical transmission devices 1600 are each disposed in a boundary between SONET/SDH network and WDM (wavelength division multiplex) network, and each bilaterally convert a client signal transmitted in the SONET/SDH network and an OTUk (k=2, 3) signal transmitted in the WDM network. It should be noted that in the example shown in FIG. 10, as the client signals, there are cited an OC3/STM-1 signal, an OC12/STM-4 signal, an OC48/STM-16 signal, and an OC192/STM-64 signal.

Such an optical transmission devices 1600 is provided with a clock generator for generating a clock corresponding to the client signal, and the clock generator incorporates an oscillator 200 including the piezoelectric vibrator element 1. In the clock generator, it is arranged that clocks different in frequency from each other can be output in accordance with the client signals different in transmission bit rate from each other. In such a case, by providing the dual-frequency switching oscillator 200, the clocks different in frequency from each other can easily be output.

As described above, by using the piezoelectric vibrator element 1 small in frequency deviation and superior in aging characteristic to the electronic apparatus, the electronic apparatus high in reliability can be provided.

It should be noted that, the piezoelectric vibrator element 1 according to the embodiment of the disclosure can also be applied to, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer 1100 (the mobile personal computer) shown in FIG. 7, the cellular phone 1200 shown in FIG. 8, the digital still camera 1300 shown in FIG. 9, and the optical transmission device 1600 shown in FIG. 10.

Vehicle

Then, a vehicle equipped with the piezoelectric vibrator 2 having the piezoelectric vibrator element 1 according to an embodiment of the disclosure will be described with reference to FIG. 11.

Figure 11:
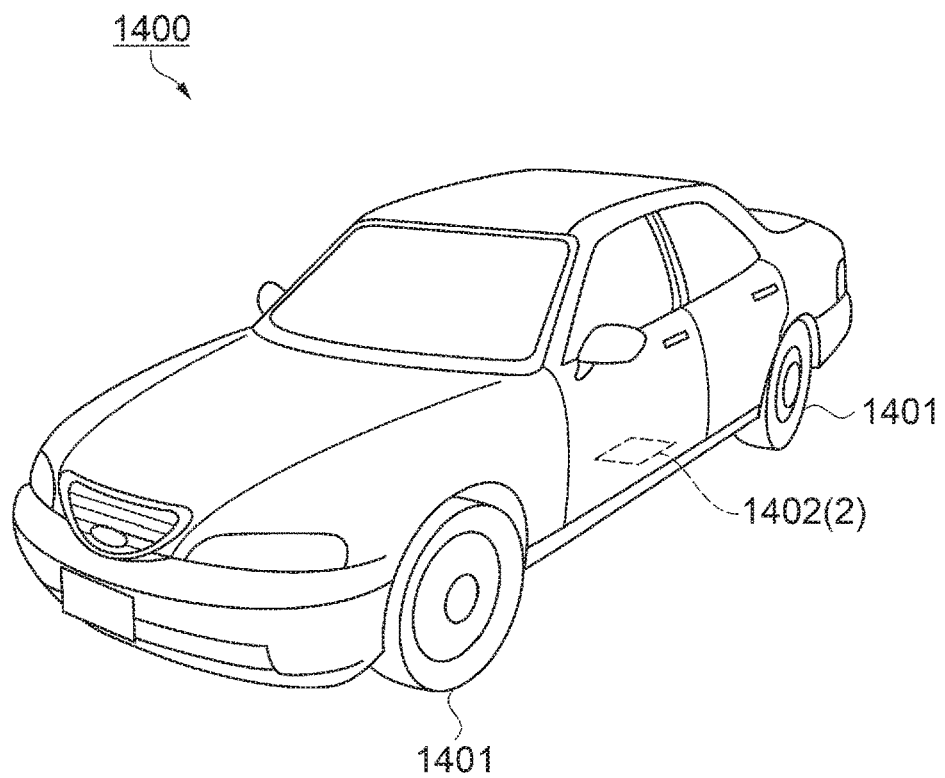
FIG. 11 is a perspective view schematically showing a car as a vehicle equipped with the piezoelectric vibrator element according to an embodiment of the disclosure.

FIG. 11 is a perspective view schematically showing a car 1400 as the vehicle equipped with the piezoelectric vibrator 2. The car 1400 is equipped with gyro sensor configured including the piezoelectric vibrator 2 according to an embodiment of the disclosure. For example, as shown in the drawing, the car 1400 as the vehicle is equipped with an electronic control unit 1402 incorporating the gyro sensor and for controlling tires 1401. Further, as other examples, the piezoelectric vibrator 2 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle body attitude control system.

As described above, by implementing the piezoelectric vibrator 2 small in frequency deviation and superior in aging characteristic to the vehicle, the vehicle high in reliability can be provided.

Although the piezoelectric vibrator element 1, the piezoelectric vibrator 2, the method of manufacturing the piezoelectric vibrator 2, the electronic apparatus, and the vehicle according to the disclosure are hereinabove described based on the embodiments shown in the accompanying drawings, the various embodiments of the invention are not limited to these embodiments, but the configuration of each of the components can be replaced with one having an arbitrary configuration with an equivalent function. Further, it is also possible to add any other constituents to the disclosure. Further, it is also possible to arbitrarily combine any of the embodiments described above with each other.

What is claimed is:

1. A piezoelectric vibrator element comprising:
   a piezoelectric substrate including a vibrating part and a fixation part;
   a first excitation electrode including
      a first foundation electrode layer disposed on a first surface of the vibrating part, and
      a first upper electrode layer disposed on the first foundation electrode layer; and
   a second excitation electrode including
      a second foundation electrode layer disposed on a second surface of the vibrating part, opposed to the first surface, and
      a second upper electrode layer disposed on the second foundation electrode layer,
   wherein a ratio $t_{42}/T_1$ between a thickness $t_{42}$ of the second upper electrode layer and a thickness $T_1$ of the vibrating part is not lower than 1.4% and not higher than 2.4%.

2. The piezoelectric vibrator element according to claim 1, wherein
   a fundamental vibration is one of equal to and higher than 250 MHz.

3. The piezoelectric vibrator element according to claim 1, wherein
   the first foundation electrode layer includes a material other than gold.

4. The piezoelectric vibrator element according to claim 1, wherein
   a material of the first upper electrode layer is gold.

5. The piezoelectric vibrator element according to claim 1, wherein
   the second foundation electrode layer is formed of the same material as the first foundation electrode layer.

6. The piezoelectric vibrator element according to claim 1, wherein
   a material of the second upper electrode layer is gold.

7. The piezoelectric vibrator element according to claim 1, wherein
   the second excitation electrode is smaller in area than the first excitation electrode.

8. The piezoelectric vibrator element according to claim 1, wherein
   the second excitation electrode is located inside an outer periphery of the first excitation electrode when viewed from a direction perpendicular to the first surface.

9. The piezoelectric vibrator element according to claim 1, wherein
   a thickness of the fixation part is thicker than a thickness of the vibrating part.

10. The piezoelectric vibrator element according to claim 1, wherein
    a thickness of the first upper electrode layer is thicker than a thickness of the second upper electrode layer.

11. The piezoelectric vibrator element according to claim 1, wherein
    the piezoelectric substrate is an AT-cut quartz crystal substrate.

12. A piezoelectric vibrator comprising:
    a piezoelectric vibrator element including
       a piezoelectric substrate including a vibrating part and a fixation part,
       a first excitation electrode including
          a first foundation electrode layer disposed on a first surface of the vibrating part, and
          a first upper electrode layer disposed on the first foundation electrode layer, and a second excitation electrode including
a second foundation electrode layer disposed on a second surface of the vibrating part, opposed to the first surface, and
a second upper electrode layer disposed on the second foundation electrode layer,
wherein a ratio $t_{42}/T_1$ between a thickness $t_{42}$ of the second upper electrode layer and a thickness $T_1$ of the vibrating part is not lower than 1.4% and not higher than 2.4%;
a substrate; and
a fixation member disposed between the fixation part and the substrate, and adapted to fix the fixation part to the substrate.

13. The piezoelectric vibrator according to claim 12, wherein
the substrate is disposed on an opposite side to the first excitation electrode with respect to the second excitation electrode.

14. The piezoelectric vibrator according to claim 12, wherein
the piezoelectric vibrator element further includes a second terminal disposed on the second surface,
the piezoelectric vibrator further includes a wiring pattern provided to the substrate,
the fixation member has electrical conductivity, and
the second terminal is electrically connected to the fixation member via the wiring pattern.

15. The piezoelectric vibrator according to claim 14, wherein
the piezoelectric vibrator element further includes a first terminal disposed on the first surface and electrically connected to the first excitation electrode, and
the piezoelectric vibrator further includes a bonding wire electrically connected to the first terminal and the wiring pattern.

16. An electronic apparatus comprising:
a piezoelectric vibrator element according to claim 1.

17. A vehicle comprising:
a piezoelectric vibrator element according to claim 1.

18. The piezoelectric vibrator element according to claim 1, wherein
the thickness $t_{42}$ of the second upper electrode layer is 400 Å (0.04 μm) and the thickness $T_1$ of the vibrating part is 2.77 μm, to thereby define a ratio $t_{42}/T_1$ of 1.4%.

19. The piezoelectric vibrator element according to claim 1, wherein
the thickness $t_{42}$ of the second upper electrode layer is 500 Å (0.05 μm) and the thickness $T_1$ of the vibrating part is 2.63 μm, to thereby define a ratio $t_{42}/T_1$ of 1.9%.

20. The piezoelectric vibrator element according to claim 1, wherein
the thickness $t_{42}$ of the second upper electrode layer is 600 Å (0.06 μm) and the thickness $T_1$ of the vibrating part is 2.48 μm, to thereby define a ratio $t_{42}/T_1$ of 2.4%.

21. A piezoelectric vibrator comprising:
a package main body having a cavity and including mounting terminals; and
a piezoelectric vibrator element within the cavity of the package main body, the piezoelectric vibrator element having a substrate and a pair of excitation electrodes conductively connected to the mounting terminals, the excitation electrodes each including a foundation layer disposed on opposed surfaces of a vibrating part of the piezoelectric vibrator element and upper electrode layers disposed on the foundation electrode layers, wherein
the piezoelectric vibrator element has an inverted-mesa structure with a fixation part disposed along an outer edge of the vibrating part and a recessed part in a central part of the substrate, a thickness of the fixation part being greater than a thickness of the vibrating part, and a ratio between a thickness of one of the upper electrode layers and a thickness of the vibrating part is between 1.4% and 2.4%.

22. The piezoelectric vibrator according to claim 21, wherein
the substrate includes a slit configured to reduce a mount stress.

23. The piezoelectric vibrator according to claim 21, wherein
the substrate is an AT-cut substrate having an angle θ of 35° 15', wherein the angle θ is defined around an x axis with the substrate carved out from a quartz crystal along a plane obtained by rotating an X-Z plane.

24. The piezoelectric vibrator according to claim 21, wherein
the fixation part is disposed along an entire outer edge of the vibrating part.

* * * * *

UNITED STATES PATENT AND TRADEMARK OFFICE
CERTIFICATE OF CORRECTION

PATENT NO. : 10,291,204 B2  
APPLICATION NO. : 15/285216  
DATED : May 14, 2019  
INVENTOR(S) : Yusuke Yamamoto Page 1 of 1

It is certified that error appears in the above-identified patent and that said Letters Patent is hereby corrected as shown below:

In the Claims

Column 18, Line 53, Claim 10, delete "thicker" and insert --thinner--.

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*